United States Patent [19]

Navratil

[11] 4,153,880
[45] May 8, 1979

[54] METHOD AND APPARATUS FOR GENERATING A HIGH FREQUENCY ROTATING MAGNETIC FIELD

[75] Inventor: Franz Navratil, Munich, Fed. Rep. of Germany

[73] Assignee: Siemens Aktiengesellschaft, Berlin & Munich, Fed. Rep. of Germany

[21] Appl. No.: 534,426

[22] Filed: Dec. 19, 1974

[30] Foreign Application Priority Data

Mar. 27, 1974 [DE] Fed. Rep. of Germany ....... 2414786

[51] Int. Cl.² ................... H03K 5/08; G11C 11/02
[52] U.S. Cl. ........................ 328/27; 307/261; 307/262; 365/6
[58] Field of Search ............ 307/261, 262; 328/27; 315/378, 409, 391; 340/174 TF

[56] References Cited

U.S. PATENT DOCUMENTS

| | | | |
|---|---|---|---|
| 2,807,750 | 9/1957 | Hobbs | 328/27 |
| 3,473,129 | 10/1969 | Tschannen | 307/262 |
| 3,697,877 | 10/1972 | Godfrey | 328/27 |
| 3,710,276 | 1/1973 | Dao | 328/27 |
| 3,720,883 | 3/1973 | Hess, Jr. et al. | 340/174 TF |
| 3,732,436 | 5/1973 | Gelenius | 307/261 |
| 3,763,478 | 10/1973 | Yoshizawa et al. | 340/174 TF |
| 3,866,145 | 2/1975 | Hess, Jr. et al. | 340/174 TF |

Primary Examiner—Stanley D. Miller, Jr.
Attorney, Agent, or Firm—Hill, Gross, Simpson, Van Santen, Steadman, Chiara & Simpson

[57] ABSTRACT

A method and apparatus for producing a high frequency rotating magnetic field, in particular for domain transport stores, utilizes a rectangular pulse sequence which is fed into two parallel connected flip-flops, one of the flip-flops having an inverter connected serially in front, effecting flip-flop output signals which are phase shifted by 90° which are fed via a terminal stage into respective coils of a Helmholtz coil pair, each of which coils are supplemented with capacitors to form resonant circuits.

3 Claims, 7 Drawing Figures

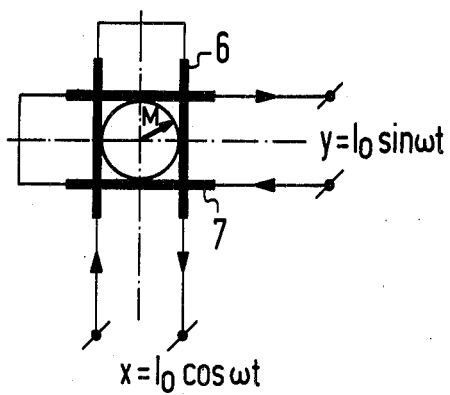
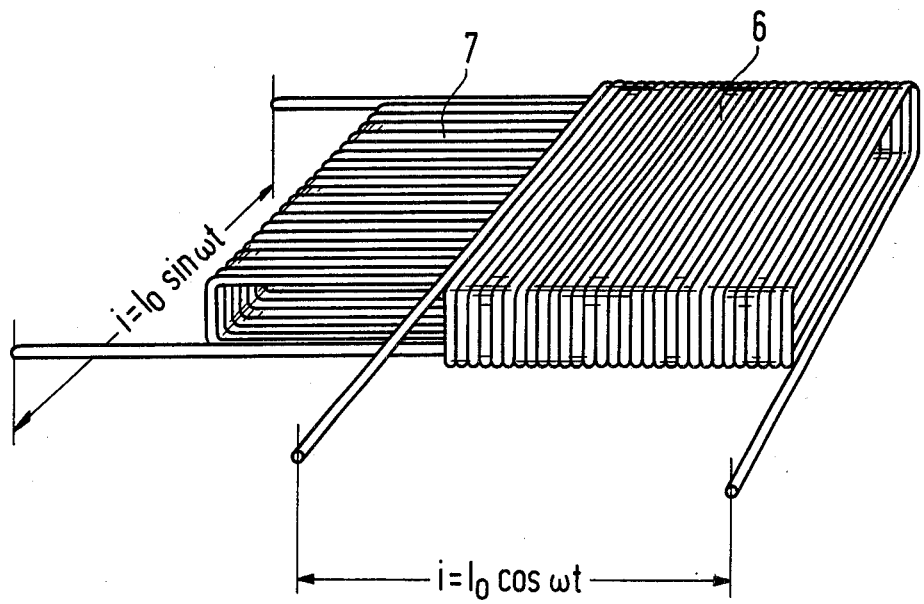

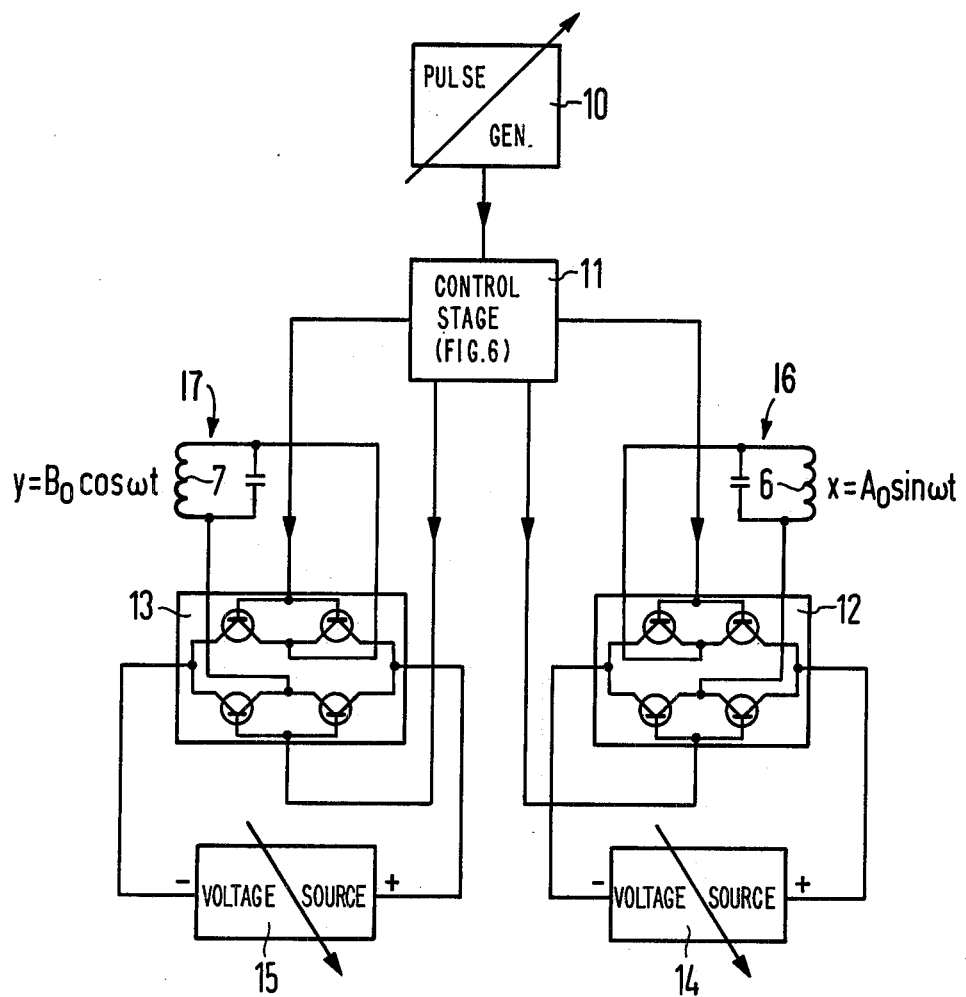

METHOD AND APPARATUS FOR GENERATING A HIGH FREQUENCY ROTATING MAGNETIC FIELD

BACKGROUND OF THE INVENTION

1. Field of the Invention

This invention relates to domain transport stores, and in particular to a method and apparatus for creating a high frequency rotating magnetic field for causing movement of cylindrical domains along paths prescribed by the manipulation pattern of the store.

2. Description of the Prior Art

Domain transport stores have a block, in particular layerlike storage medium, consisting of magnetic garnet or orthoferrite for example and having magnetized cylindrical domains which extend perpendicular to the layer plane, whereby the magnetization is opposite to the magnetization of the surrounding area and to a magnetic supporting field serving for the stabilization of the cylindrical domains, and aligned perpendicular to the plane of the layer and a preferably periodic manipulation pattern. The individual elements of the magnetizable material, in particular consisting of a magnetostriction-free NiFe alloy are applied in layers, or in a rectangular manner, onto one of the layer surfaces. For the manipulation of the cylinder domains a high frequency rotary magnetic field is utilized, which field has a field vector which rotates parallel to the plane of the layer.

In the above-mentioned magnetic rotary field, the individual elements of the manipulation pattern create magnetic scatter fields under whose effect cylindrical domains travel to energetically more favorable positions at the individual elements. In case of a suitable geometry of the manipulation pattern, the cylindrical domains move in a complete rotation of the rotary magnetic field by one period of the manipulation pattern, which means that they are stepped along one storage location at a time. In a continuously rotating magnetic field, therefore, the cylindrical domains can be transported along paths prescribed by the manipulation pattern.

The rotary magnetic field required for transport of the cylindrical domains, as is generally known, is created in a pair of coils, commonly known as Helmholtz coils, which are perpendicularly oriented in respect of each other, whereby, for energy considerations, the individual coils are in each case supplemented by capacitances to form resonant circuits which are controlled by a sine or cosine current, respectively. In order to receive an ideally rotating magnetic field in the operating space of the pair of coils, the phase position and the amplitude of the control currents must be observed, since only with equal amplitudes and correct phasing is it guaranteed that a circle is prescribed by the terminal point of the rotating magnetic field vector.

SUMMARY OF THE INVENTION

The present invention is therefore based on the object of providing a method and apparatus for creating a high frequency rotating magnetic field which has a relatively high initial performance and which can be switched off at a time which is short in comparison to the duration of the period and which can have its frequency controlled in a desired range.

More specifically, the object of the invention is to provide for the creation of two sinusoidal currents which are accurately phased by 90° in phase position in respect of each other and which can have their respective amplitudes independently controlled.

According to the method of the invention for creating a high frequency rotating magnetic field wherein 90° phase shifted, accurately phased, sinusoidal currents are fed into a pair of crossed, preferably orthogonally aligned, coils, the aforementioned object is achieved in that a pulse sequence of controlled frequency is transformed by a flip-flop into a square pulse sequence, that the resulting square pulse train is fed into two parallel connected flip-flops, via an inverter with respect to one of these flip-flops, and that the digital output signals of the flip-flops, which are phase shifted by 90° in respect of each other, are fed to and control terminal stages whose outputs are connected to respective ones of the coils, the coils being supplemented by capacitances to form resonant circuits.

By means of the digital control of the terminal stages, for which purpose it is preferable to provide switching amplifiers which are constructed with rapid switching transistors, and the type of creation of the control pulses, sinusoidal currents which are accurately phase shifted by 90° can be fed into the resonant circuits simply, reliably and independently of the rotational frequency. In addition, and contrary to the sinusoidal control of the terminal stages, higher control voltages can be safely applied, whereby higher energy can be pumped into the coils which have been supplemented by capacitances to form resonant circuits. Also, the coil volume and therefore the storage module can be larger.

A further advantage of the digital control of the terminal stages is constituted by the abrupt deactivation of the rotary magnetic field, which is especially significant during the operation of domain transport stores. The method according to the present invention, in addition, makes a high energy release possible in the case of a high rotational frequency, for example 18W at 1 MHz, and notwithstanding the considerable energy increase, makes possible a simplified structure of the terminal stages.

If each of the terminal stages is connected to a respective voltage source which can be independently controlled, then both coils of the coil pair can be adjusted to the same field amplitude, thereby guaranteeing that the field vector of the rotating magnetic field accurately prescribes a circle.

BRIEF DESCRIPTION OF THE DRAWINGS

Other objects, features and advantages of the invention, its organization, construction and operation will be best understood from the following detailed description taken in conjunction with the accompanying drawings, on which:

FIG. 2 is a schematic illustration of a coil pair energized to provide a rotating magnetic field;

FIG. 4 is a pictorial representation of a pair of crossed coils which may be utilized in practicing the present invention;

FIG. 5 is a block diagram which illustrates the method and apparatus for practicing the invention;

DESCRIPTION OF THE PREFERRED EMBODIMENT

Figure 1:
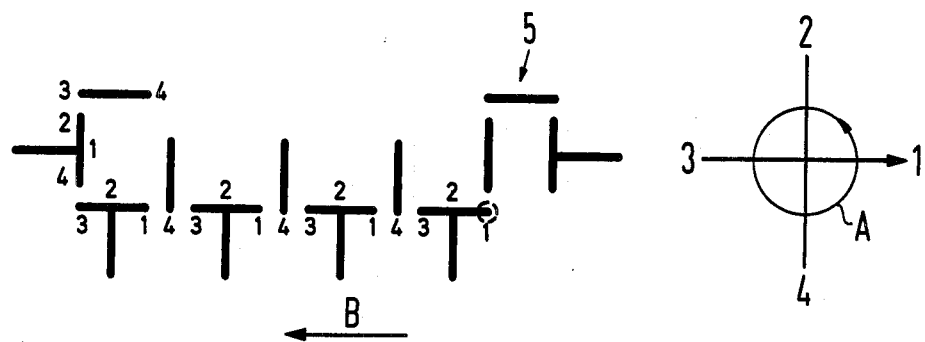
FIG. 1 is a schematic illustration of a manipulation pattern of a domain transport store and a graphic illustration of a rotating magnetic field for moving cylindrical domains along paths prescribed by the manipulation pattern.

Referring first to FIGS. 1-4, the individual elements of a manipulation pattern create magnetic scatter fields under whose effect cylindrical domains travel to energetically more favorable positions, as previously mentioned. In the case of a suitable geometry of the manipulation pattern, one of which is schematically illustrated in FIG. 1, the cylindrical domains more during a full rotation of the rotary magnetic field in the direction of the arrow B by means of magnetic field rotation in accordance with the arrow A by one period of the manipulation pattern 5. As viewed in FIG. 1 this means that the cylindrical domains move by one period of the manipulation pattern 5 from 1 to 4 as they advance by one storage location. In a continuous rotating magnetic field, therefore, the cylindrical domains can be transported along paths prescribed by the manipulation pattern.

Figure 3:
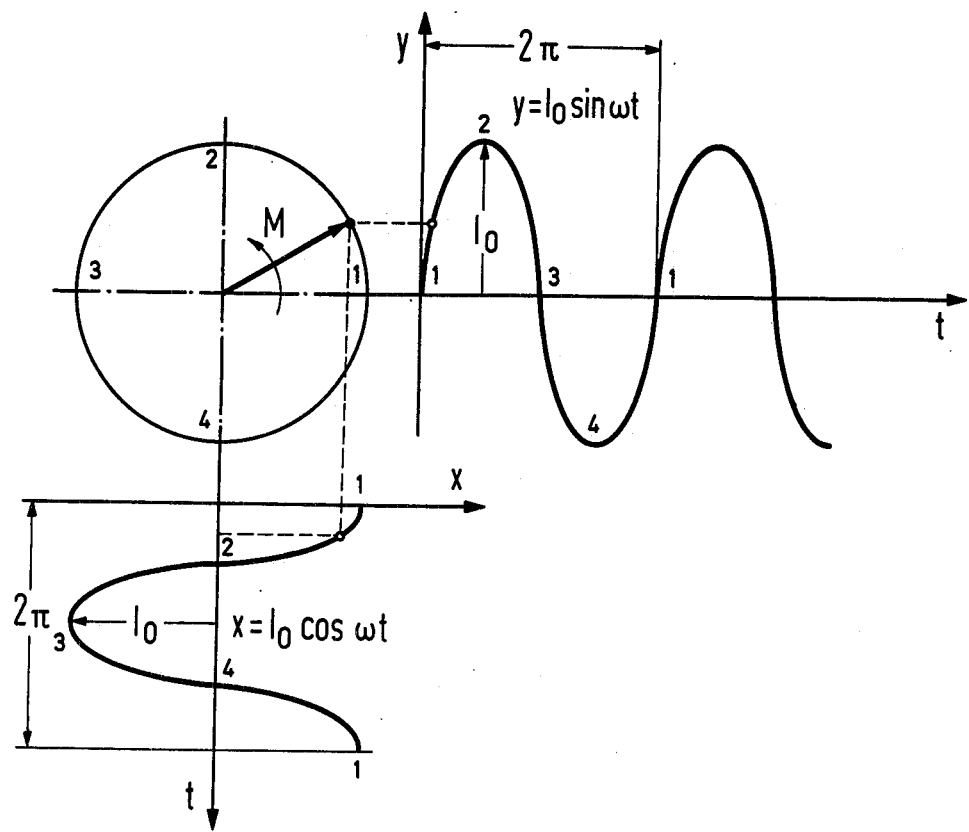
FIG. 3 is a graphic illustration of the summation of a sine current and a cosine current to provide a rotating magnetic field vector.

The generation of a rotating magnetic field is generally known in the art and is schematically illustrated in FIGS. 2-4 in which a pair of coils 6 and 7, commonly known as Helmholtz coils, are oriented perpendicularly to each other and have sine or cosine currents applied thereto as indicated on the drawings. These coils 6 and 7 are supplemented by respective capacitances (8, 9 in FIG. 5) to form resonant circuits, as is also well known in the art. In order to provide an ideally rotating magnetic field in the operating space of the pair of coils, the phase position and the amplitude of the control currents must be observed, since only by the provision of equal individual fields which are phased 90° with respect to each other is it possible to provide a magnetic field vector which accurately prescribes a circle.

Figure 7:
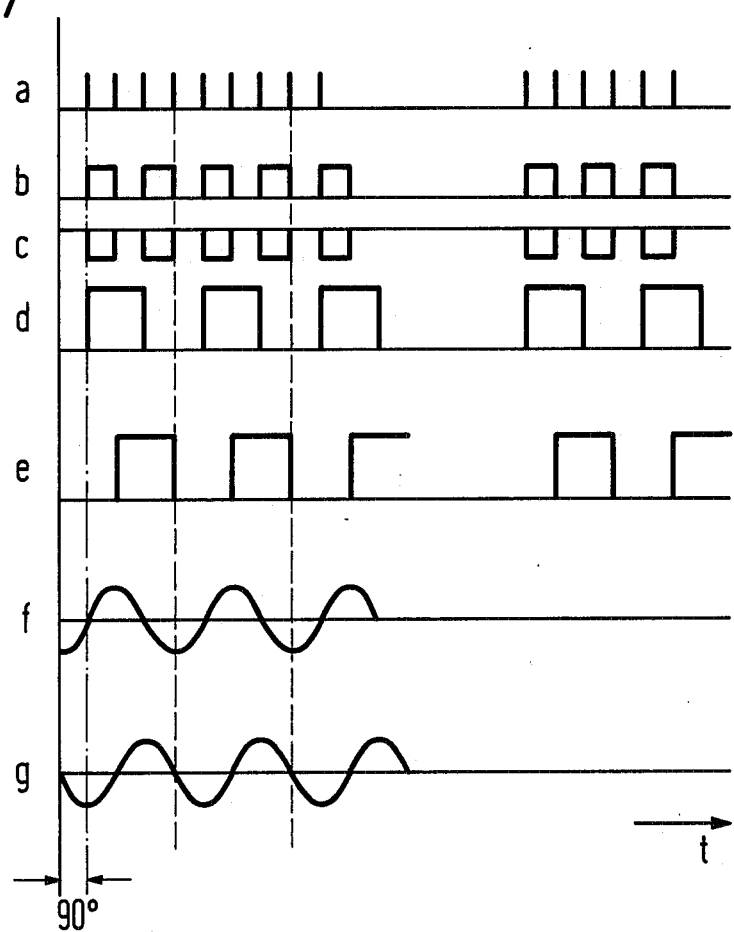
FIG. 7 is a waveform chart which is provided for aiding in understanding the present invention.

FIG. 5 illustrates, in a block diagram form, a pulse generator 10 which generates needle-shaped pulses in a sequence of constant frequency as illustrated in trace a of FIG. 7. The frequency of the needle-shaped pulses, due to the frequency reduction based on the subsequently connected control stage 11, amounts to four times the desired frequency of the rotary field generator. For a generator frequency of 1 MHz, the needle-shaped pulse frequency would be a maximum of approximately 4 MHz. These pulses are distinguished and particularly characterized by rapidly rising, steep leading edges.

Figure 6:
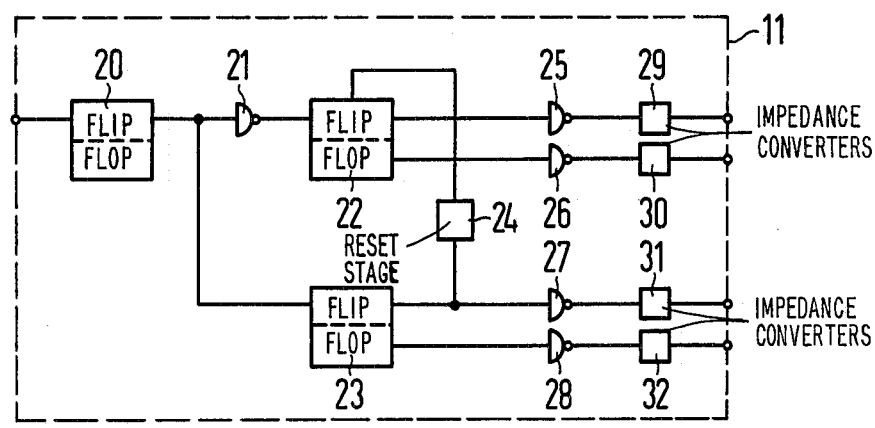
FIG. 6 is a schematic logic diagram of a digital control stage which may be utilized in the arrangement of FIG. 5.

The digital control stage 11, which is also illustrated in greater detail in FIG. 6, is provided on its input side with a flip-flop 20 for receiving the needle-shaped pulses. Two flip-flops 22 and 23 are connected to the output of the flip-flop 20, the flip-flop 22 being connected by way of an inverter 21, so that they operate substantially in parallel. Each of the outputs of the flip-flops 22 and 23 are connected by way of respective separating stages, in the form of inverters 25-28, and respective impedance converters 29-32 to provide the outputs of the digital control stage 11. The reset input of the flip-flop 22 is connected by way of a reset stage 24 with one of the outputs of the flip-flop 23, whereby equal initial conditions are created and thereby a random rotary direction change in the magnetic field is prevented.

The two outputs (29, 30 and 31, 32) of the digital control stage 11 are connected with a respective terminal stage 12, 13 which serves as the aforementioned transistorized rapid switching amplifiers. The terminal stages (amplifiers) 12 and 13 are connected to respective independently controllable voltage sources 14 and 15, respectively. The coils 6 and 7 of the crossed coil pair are illustrated in FIG. 5 and are connected with capacitances 8 and 9 of the respective terminal stages 12 and 13, to form respective resonant circuits 16 and 17.

The current supply of the pulse generator 10 takes place by means of the current source of conventional design which is stabilized with respect to frequency and with respect to balance of voltage fluctuations.

The current supply of the control stage 11 also takes place by means of an independent, stabilized voltage source (also not illustrated but of conventional design).

The mode of operation of the rotating magnetic field generator may be best understood by reference to the pulse sequence diagram of FIG. 7. The pulse sequence according to trace a of FIG. 7, is created by the pulse generator 10 and is fed into the control stage 11. More specifically, the needle-shaped pulses are fed to the flip-flop 20 where they are transformed into the rectangular pulses illustrated in trace b.

The pulses according to trace b are fed to the parallel connected flip-flops 22 and 23. The rectangular pulses of the flip-flop 20 which are fed into the flip-flop 22 experience a phase inversion due to the inverter 21 which is connected between the flip-flop 20 and the flip-flop 22. This phase inversion is illustrated in trace c in which the pulses are 180° out of phase with the corresponding pulses in the trace b.

The output signals of the flip-flops 22 and 23 are illustrated in traces d and e, respectively, and are seen to be phase shifted in respect of each other by 90°. These signals digitally control the terminal stages 12 and 13 by way of the aforementioned separating and impedance converting stages 25-32.

As previously mentioned, a reset stage 24 is connected from an output of the flip-flop 23 to a reset input of the flip-flop 22 to establish initial conditions which would prevent a random and consequently undesired change in direction of the rotating magnetic field.

The terminal stages 12 and 13, which is mentioned above are switching amplifiers, are responsive to the digital control signals illustrated in traces d and e of FIG. 7 to convert these control signals into magnetic energy, whereby, due to the shape of the control pulses, the mode of operation of the terminal stages, namely the switching amplifiers is already basically determined. By means of common switching technical measures which are well known to those versed in the art and are therefore not explained in greater detail herein, an output energy of almost 20 Watt per output of the terminal stages can be achieved. The output signals of the digital control stage 11 which are amplified by the terminal stages 12 and 13, respectively, are fed into the crossed coils 6 and 7, respectively, which are, as mentioned above, connected with the capacitors 8 and 9 to form LC resonant circuits 16 and 17, and are transformed into the sinusoidal currents illustrated in traces f and g of FIG. 7 which are 90° out of phase.

The separate terminal stages 12 and 13 are supplied by respective independent and separately controllable voltage sources 14 and 15. With this structure, the energy at the output of each terminal stage can be controlled and therefore a symmetrical adjustment of the field can be achieved.

The above-described method and the rotary magnetic field generator offered as an exemplary embodiment for the implementation of this method make the creation of a high frequency rotating magnetic field possible by providing output signals at the two terminal stages which are accurately phase shifted by 90° across a wide frequency range. By means of the control of the terminal stages by steep edge switching pulses, instead of high frequency currents, all requirements for the provision of a high frequency rotating magnetic field can be achieved without difficulty, in particular in respect of the adjustability across a broad frequency range and in the balancing of the separate magnetic fields which combine to cause the rotating magnetic field of circular character. The digital control of the terminal stages makes it possible not only to control the terminal stages in an improved manner, but also considerably facilitates the requirements in view of the variability of the frequency, in case of a rigid 90° phase difference of the sinusoidal signals at both outputs of the terminal stages. Due to the resonant circuits required for reasons of energization of the crossed coils 6 and 7, they only sift out the basic frequency from the pulse sequence fed thereto and a high frequency field is nevertheless achieved.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. Apparatus for generating a high frequency rotating magnetic field, comprising:

a pulse generator adjustable in its frequency for generating periodic first pulses;

a first flip-flop including an input and an output, said input connected to said pulse generator, and said first flip-flop responsive to said first pulses to generate periodic rectangular second pulses at said output;

an inverter connected to said output of said first flip-flop;

a second flip-flop including an input and an output, said input connected to said output of said first flip-flop via said inverter to receive inverted second pulses, and a third flip-flop including an input and an output, said input connected to said output of said first flip-flop to receive said second pulses, said second and third flip-flops operable in response to the pulses applied thereto to generate, at their respective outputs, periodic rectangular third pulses and periodic rectangular fourth pulses phased 90° with respect to said third pulses;

a pair of resonant circuits including respective capacitors and coils said coils oriented 90° in respect of each other; and a pair of switching amplifiers respectively connecting said outputs of said second and third flip-flops to respective ones of said resonant circuits and responsive to said third and fourth pulses respectively to effect generation of 90° phased sinusoidal currents which energize said coils to together produce the rotating magnetic field.

2. The apparatus of claim 1, comprising a pair of adjustable voltage sources connected to respective ones of said switching amplifiers to balance the respective magnetic fields.

3. The apparatus of claim 1, wherein said second flip-flop includes a reset input, and comprising a reset circuit connected between said output of said third flip-flop and said reset input of said second flip-flop to insure a predetermined direction of field rotation.

* * * * *